United States Patent [19]
Ouellet

[11] Patent Number: 5,457,073
[45] Date of Patent: Oct. 10, 1995

[54] MULTI-LEVEL INTERCONNECTION CMOS DEVICES WITH SOG

[75] Inventor: Luc Ouellet, Granby, Canada

[73] Assignee: Mitel Corporation, Kanata, Canada

[21] Appl. No.: 39,485

[22] PCT Filed: Sep. 25, 1991

[86] PCT No.: PCT/CA91/00343

§ 371 Date: Apr. 30, 1993

§ 102(e) Date: Apr. 30, 1993

[87] PCT Pub. No.: WO92/06492

PCT Pub. Date: Apr. 16, 1992

[30]      Foreign Application Priority Data

Oct. 1, 1990 [CA] Canada .................................. 2026605

[51] Int. Cl.⁶ .................................................. H01L 21/469
[52] U.S. Cl. ........................ 437/231; 437/225; 437/228
[58] Field of Search ................................. 437/231, 228, 437/225

[56]             References Cited

U.S. PATENT DOCUMENTS 4,962,063  10/1990  Maydan et al. ...................... 437/228

OTHER PUBLICATIONS

L. D. Molnar, "SOG Planarization Proves Better Than Photoresist Etch Back," Aug. 1989, pp. 92–96.
Wolf et al., vol. II, Silicon Processing for the VLSI Era, Lattice Press, 1990, pp. 268–273.
H. G. Tompkins & C. Tracy, J. Electrochem. Soc., vol. 136, No. 8, pp. 2331–2335 "Desorption from Spin-On Glass".

*Primary Examiner*—Brian E. Hearn
*Assistant Examiner*—Lynne A. Gurley

[57]             ABSTRACT

A method of manufacturing a semiconductor wafer, which includes performing a first metallization to deposit a first layer of interconnect material on a substrate, etching the interconnect material to form interconnect tracks, depositing a first low temperature dielectric layer over the interconnect tracks, planarizing the first low temperature dielectric layer with quasi-inorganic or inorganic spin-on glass by a non-etchback process, depositing a second low temperature dielectric layer over the spin-on glass, etching via holes through the dielectric and spin-on glass layers to reach the tracks of the first interconnect layer, performing an in-situ desorption of physically and chemically bonded water vapour in a dry environment at a temperature of at least 400° C. and not more than 550° C. for a time sufficient to obtain a negligible desorption rate, the temperature exceeding by at least 25° C. the temperature to which the surface of the wafer will be exposed during a subsequent metallization step, and performing the subsequent metallization step to deposit a second interconnect layer extending through the via holes to the first interconnect tracks without re-exposure of the wafer to ambient conditions, and keeping this wafer under vacuum. This technique permits the reliable use of inorganic or quasi-inorganic spin-on glasses in non batch type sputtering equipment.

9 Claims, 5 Drawing Sheets

MULTI-LEVEL INTERCONNECTION CMOS DEVICES WITH SOG

This invention relates generally to the fabrication of semiconductor wafers, and more particularly to a method of manufacturing a semiconductor wafer, wherein at least one high-temperature resistant water absorbant, organic or quasi-organic dielectric layer is formed between first and second layers of deposited interconnect material interconnected through vias opened in the dielectric layer.

Spin-on glass (SOG) is a proprietary liquid solution containing silicate (purely inorganic spin-on glasses) or siloxane (quasi-inorganic spin-on glasses) based monomers diluted in various kinds of solvents or alcohols. It is mainly employed as a planarizing medium in the manufacture of semiconductor wafers to fill in trenches formed during the fabrication process, which involves depositing a plurality of layers, some of which are partially etched during the fabrication process. During coating and curing, monomers are polymerized by condensation of silanol, •SiOH, and ethoxy groups, •SiOC$_2$H$_5$, and release water vapour, ethanol, and other by-products according to the following scheme:

Polymerization of the SOG solution ceases when the distance between neighboring silanol groups, •SiOH, becomes too large or when too much by-product, such as water vapour, blocks the condensation mechanism. Heating is then needed to eliminate condensation by-products and permit further condensation, densification, and the formation of a hard inorganic or quasi-inorganic film, i.e. the SOG film.

The final density of the SOG films depends on many factors but is generally lower than the density of other inorganic or quasi-inorganic glasses deposited by other commonly used techniques like LPCVD or PECVD. This lower density is due to the presence of many pores in the SOG film, which cause high conductance channeling paths between the film surface and its bulk. These pores permit the adsorbed gas molecules present on the SOG film surface to continuously and rapidly diffuse through the bulk of the film and to rapidly connect physically to the glass by forming low energy (<0.1 eV) Van der Waals bonds (drawn as "• •" in the following scheme); the gas molecules are rapidly absorbed physically by the SOG film network.

Some gases, such water vapour, have molecules that can slowly form high energy (>0.1 eV) chemical bonds (drawn as "•" in the following scheme) with the SOG film network by forming a pair of silanol groups, •SiOH. Water vapour molecules are slowly chemically absorbed by the SOG film network.

This slow chemical absorption of water vapour by the SOG film is particularly efficient if the SOG solution contains phosphorus organometallic molecules, which give very efficient water vapour gettering due to the presence of phosphorus-oxygen double bounds in the SOG film, as shown by the following scheme:

-continued

This gettering of water vapour by absorption can be verified by infrared spectroscopy by monitoring the behaviour of these P:O bonds and other bonds in the presence of water vapour [see for example, R. M. Levin, J. Electrochem. Soc., Vol. 129, No. 8, pp. 1765–1770; M. Noyori and Y. Nakata, J. Electrochem. Soc., Vol. 131, No. 5, pp. 1109–1114].

As a reference, the following tables give the approximate location of the infrared absorption bands associated with the different inter-atomic vibrations of some selected bonds associated with the interaction of water vapour with phosphorus doped inorganic silicate thin films:

|  | APPROX. WAVE NUMBER [cm$^{-1}$] |
|---|---|
| RELATED TO "OXYGEN-HYDROGEN" VIBRATIONS | |
| in phase stretching of O—H in "H.OH" | 3350 |
| in phase stretching of O—H in "H.OSi" | 3650 |
| in phase stretching of O—H in "H.OP" | 3700 |
| RELATED TO "OXYGEN-SILICON" VIBRATIONS | |
| rocking of Si—O—Si | 460 |
| banding of Si—O—Si | 810 |
| in phase stretching of O—Si in "Si.OH" | 930 |
| in phase stretching of O—Si in "Si.OSi" | 1070 |
| in phase stretching of O—Si in "Si.OP" | 1090 |
| out of phase stretching of O—Si in "Si.OSi" | 1140 |
| RELATED TO "OXYGEN-PHOSPHORUS" VIBRATIONS | |
| in phase stretching of O—P in "P:O" | 1280 |
| in phase stretching of O—P in "P.O" | 1070 |
| in phase stretching of O—P in "P.OH" | 950 |
| in phase stretching of O—P in "P.OSi" | 1160 |
| in phase stretching of O—P in "P.OP" | 1200 |

According to the mechanism discussed above, adsorbed water vapour molecules rapidly diffuse in the pores of the SOG, become rapidly physically absorbed (3350 cm$^{-1}$), and slowly become chemically absorbed by —P:O bonds (1280 cm$^{-1}$) and —Si•O•Si— bonds (460, 810, 1070 and 1140 cm$^{-1}$) to form respectively —P•OH (950 and 3700 cm$^{-1}$) and —Si•OH (930 and 3650 cm$^{-1}$) groups.

The same mechanism is observed for glasses other than spin-on glasses and has been reported for low temperature LPCVD and PECVD silicates. It is believed that this mechanism is universal and should be observed for any type of glass. It is also believed that the lower the film porosity, implying less pores and smaller conductance from the film surface to its bulk, the slower the water vapour channeling, its physical absorption and chemical absorption.

Published literature [S. R. Hofstein, IEEE Trans. Electron Devices, Vol. ED-14, No. 11, pp. 749–759; M. Noyori, T. Ishihara and H. Higuchi, IEEE/PROC. IRPS 1982, pp. 113–121; N. Lifshitz and G. Smolinsky, J. Electrochem. Soc., Vol. 136, No. 8, pp. 2335–2340; H. G. Tompkins and C. Tracy, J. Electrochem. Soc., Vol. 136, No. 8, pp. 2331–2335] shows the time dependance of water vapour absorption by porous glasses: there is a rapid physical absorption, characterized by a $t^{1/2}$ behaviour, and a slow chemical absorption, characterized by a $t^{1/4}$ behaviour. According to these models, the less porous the material, the slower the diffusion through residual pores and the slower the physical as well as chemical absorption rates, down to a limit which represents diffusion and absorption rates associated with a perfectly packed amorphous glass.

Our Canadian patent application no. 2,017,720, filed on May 29, 1990 discloses that these physical and chemical reactions involving water vapour and •P:O or •SiOSi• bonds are reversible at a relatively low temperature. The •POH (950 and 3700 cm$^{-1}$) and •SiOH (930 and 3650 cm$^{-1}$) groups disappear while •P:O bonds (1280 cm$^{-1}$) and •SiOSi bonds (460, 810, 1070 and 1140 cm$^{-1}$) re-appear if the film is exposed to a dry ambient or preferably a vacuum at temperature of about 400° to 500° C. for a time sufficiently long to permit:

(1) Slow chemical desorption, or destruction of chemical bonds with the glass network (2) Rapid physical desorption, or destruction of the Van der Waals bonds with the glass network (3) Rapid diffusion from the bulk to the surface through adjacent pores (4) Rapid desorption from the surface.

A recently published paper [J. N. Cox, G. Shergill and M. Rose, PROC. VMIC, 1990, pp. 419–424] proves that this water desorption mechanism and most of the adsorbed water vapour at the surface is readily eliminated during pump-down at room temperature. It also establishes that vacuum heating at about 150° C. is sufficient to quickly remove physically absorbed water vapour, and that a higher temperature vacuum heating at about 450° to 500° C. is necessary to completely eliminate chemically absorbed water vapour.

Another recently published paper [R. A. M. Wolters, PROC. VMIC, 1990, pp. 447–449.] shows water vapour, $H_2O$, carbon monoxide, CO, and carbon dioxide, $CO_2$, desorption rates from a purely inorganic phosphorus doped spin-on glass, Tokyo Ohka Kogyo OCD-2P-48316-SG. These gases were adsorbed and absorbed during cool-down from a cure cycle of 425° C. and also during storage. A heat treatment at a temperature of about 150° C. is very suitable to insure rapid desorption of physically bonded water vapour, and that a higher temperature heat treatment at about 425° to 450° C. is necessary to insure desorption of chemically bonded water If the glass is too porous, as in the case of spin-on glasses and very porous LPCVD and PECVD glasses, its re-exposure to moist air causes extremely rapid readsorption of water vapour at the film surface, rapid diffusion from pore to pore, rapid physical reabsorption and chemical reabsorption that is so quick that misunderstanding of film quality, when verified by ex-situ analysis techniques, can happen.

This is the case for spin-on glass. G. Smolinsky, a worldwide spin-on glass expert from AT&T [N. Lifshitz and G. Smolinsky, Electrochemical Society short course "Spin-on dielectrics for state-of-the-art VLSI applications", Seattle, Wash., Oct. 14, 1990.], claims that spin-on glasses cannot be used in the manufacturing of high density and high performance multi-level metallization CMOS devices because residual silanol groups, •SiOH, cannot be eliminated without a temperature treatment that exceeds about 800° C., as verified by infrared spectroscopy, triangular voltage sweep, and vias chain measurement techniques.

In fact, it is shown in our recent copending patent application No. 2,017,720, filed on May 29, 1990 that residual water vapour, which is chemically absorbed as •POH or •SiOH groups, is eliminated by a much lower temperature heat treatment of about 425° to 450° C., if under vacuum. It is also proven in the same patent application that a very short exposure of the order of 30 minutes to ambient air is long enough to permit adsorption, physical absorption and chemical absorption of water vapour by SOG, thus explaining Smolinsky's misinterpretation.

It is also known that a heat treatment from 425° C. to more than about 800° C. will increase the density of an SOG film by about 10%, thus closing the pores at high temperature. The high temperature exposed SOG, and the low temperature exposed SOG, do not show residual physically or chemically absorbed water vapour when under vacuum, but re-exposure of the latter to the ambient will cause a quick water vapour reabsorption while the former will not show "short time" reabsorption due to the small amount of pores.

In the fabrication of semiconductor wafers using a non-etchback SOG process, layers of interconnect material and dielectric are built up, with the dielectric planarized by the SOG. When the vias are opened up, the SOG comes into contact with the interconnect material deposited therein. Since typical temperatures do not exceed 500° C. for this part of the process in order to prevent growth of hillocks and stress migration problems, the SOG is generally porous and can absorb water vapour.

Since the cure temperature of the SOG used to smooth these glasses is also limited to less than 500° C., and since it will be even more porous than the surrounding glass, it will physically adsorb more water vapour as bonded $H_2O$ and chemically absorb more of it as •SiOH groups than its equivalent volume of slightly porous PECVD or LPCVD glass. In the same way, if the SOG and LPCVD or PECVD glasses incorporate phosphorus, water vapour can also be chemically absorbed as •POH groups.

The presence of water vapour in these dielectrics (LPCVD or PECVD glass and SOG) can cause serious manufacturing problems such as vias poisoning, dielectric cracking and blistering, as well as reliability problems of the completed device in the field. It is therefore important to prevent rapid adsorption, rapid physical absorption and slow chemical absorption by these two dielectrics during device manufacturing to prevent these problems and insure device protection by gettering of the water vapour by the glass and the SOG.

Our copending patent application No. 2,017,720, filed May 29, 1990, shows that rapid adsorption, rapid physical absorption and slow chemical absorption of water vapour are reversible at relatively low temperatures, lower than about 500° C., and that the use of a batch equipment for the deposition of the top LPCVD or PECVD glass is very efficient for removing adsorbed, physically absorbed and chemically absorbed water vapour in the SOG before capping it with a dense LPCVD or PECVD glass which prevents water vapour readsorption and reabsorption by the SOG.

This rapid readsorption, rapid physical reabsorption and slow chemical reabsorption of water vapour are prevented until the top protective dielectric is opened when etching via contacts to the first level of interconnect material. Since the SOG pores are under vacuum (LPCVD and PECVD are low pressure processes), SOG will very rapidly adsorb and physically absorb water vapour and other atmospheric gases ($N_2$, $O_2$, CO, $CO_2$) when exposed to air or any non-vacuum ambient. Chemical absorption will slowly occur.

The elimination of readsorbed and reabsorbed water vapour and ambient gases should be done before the metallization of the via holes in the dielectric which isolates first and second levels of interconnect to prevent the previously mentioned yield and reliability problems, as well as vias poisoning, vias corrosion, metallization step coverage problems in these vias, stress migration and electromigration problems.

After desorption of water vapour from the SOG, it is possible to deposit the second level of interconnect material. This metal based interconnect material covers the top, sidewall and bottom of the via and, in combination with the second layer of dense LPCVD or PECVD dielectric, protects the SOG against readsorption and reabsorption of water vapour and other ambient gases.

The resulting device then incorporates an integrated gettering material, the dry SOG, that will ensure an improved reliability against water vapour penetration to the active device transistors during highly accelerated stress testing (HAST), temperature and humidity bias testing (THB), other reliability testing, or simply in the field.

As disclosed in our recent copending patent application referred to above, it is possible to ensure desorption of adsorbed, physically absorbed and chemically absorbed water vapour and to leave SOG pores under vacuum before capping it by the deposition of the second layer of dense and protective LPCVD or PECVD dielectric.

Exposure of the SOG layer to ambient occurs after opening the via and water vapour readsorption and physical reabsorption occurs rapidly while chemical readsorption occurs more slowly.

Single wafer sputtering apparatus is required to ensure: high throughput, high uniformity, precisely controlled high temperature and high bias metallization of aluminium alloys and Ti and W containing alloys and compounds.

To maintain a production compatible throughput of a non etch-back spin-on glass process for the interconnection of high performance and high density multi-level metallization CMOS devices, it is necessary to provide in-situ desorption of adsorbed, physically absorbed and chemically absorbed water vapour from SOG before depositing the second level of interconnect material with single wafer sputtering equipments.

In the prior art total and partial etch-back spin-on glass processes are widely used for the interconnection of CMOS devices which incorporate SOG over the first level of temperature sensitive interconnect material. In these etch-back processes, SOG is totally etched away in the area over the first level of interconnect material and is then absent in areas where vias are formed. This prevents water vapour readsorption and readsorption into the vias, but does not permit interconnection of high performance and high density multi-level metallization CMOS devices because of the tight process window of this complex process.

Dual via etch, non etch-back spin-on glasses processes have been proposed, which use a first oversized via hole etch, then the deposition of a conformal, protective layer to cover the SOG present on the sidewall of the via, and then the etch of a second correctly sized via hole etch that prevents the exposure of SOG. This extremely precise via etch sequence is not suitable for the interconnection of high performance and high density multi-level metallization CMOS devices because of the restriction of smaller and smaller via sizes.

Non etch-back, quasi-inorganic spin-on glass processes have been proposed. These processes use methyl, •$CH_3$, or phenyl, •$C_6H_5$, containing quasi-inorganic SOG that permit thicker coatings of SOG without cracking. These processes suffer from many drawbacks: Firstly, they are not stable at temperatures exceeding about 450° C. and, for that reason, prohibit the use of very attractive high temperature processes, such as LPCVD tungsten and high temperature sputtering for via filling and step coverage improvement respectively. Secondly, they are readily destroyed by oxygen, $O_2$, plasma treatments which are needed for dry photoresist stripping. These SOGs contribute to the formation of a carbon based residue at the bottom of the etched via which can cause high specific via contact resistance, and they can cause field inversion problems to sensitive CMOS devices because of the presence of these organic bonds.

The use of partial etch-back or non etch-back quasi-organic SOG processes is not suitable for the interconnection of high performance and high density multi-level metallization CMOS devices.

Non etch-back, purely inorganic spin-on glass processes have been proposed. These processes use batch type metallization equipment and very short delays between via etching, post via etch photoresist stripping, post stripping inspection, and via metallization itself. They use tightly controlled ambient dry boxes for wafer storage if extended periods are needed between these steps. This avoids slow chemical absorption of water vapour by the exposed SOG.

Just before entering the sputtering equipment, a pre-metallization water vapour desorption step may be performed in an independent vacuum or dry ambient batch system, for an extended period of more than about 30 minutes and at temperatures as high as about 500° C. A quick re-exposure to ambient air will cause surface reabsorption and physical reabsorption of water vapour, while chemical reabsorption is prevented due to a too short re-exposure time.

The rate of reabsorption, physical reabsorption and chemical reabsorption of water vapour can be evaluated by monitoring the stress behaviour of spin-on glass wafers that are exposed to air following removal from the batch LPCVD equipment after an in-situ cure and before deposition of its protective film. This is possible since water vapour filling the pores under vacuum causes the film to expand and generates a compressive stress; the stress of the film, initially under tensile stress, will become less and less tensile and may become compressive as water vapour is physically absorbed.

This fast readsorption and physical reabsorption causes the film to rapidly change its stress toward compression. Inversely, the slow chemical reabsorption causes the film to slowly change its stress toward tension. The observation of the SOG stress behaviour with time of contact with ambient air gives information on the rate of adsorption, physical absorption and chemical absorption.

Water vapour is adsorbed and physically absorbed by SOG within the first five hours and is continuously and slowly chemically absorbed; the longer the SOG film exposure to ambient air, the more water vapour is chemically absorbed.

The amount of chemically absorbed water vapour is also a function of the ambient air relative humidity. This is demonstrated by the following graph which correlates the equilibrium stress and the ambient air relative humidity:

A non etch-back purely inorganic spin-on glass process can be carried out using standard metallization equipment with:

a) The specification of short delays in ambient air between via etching, post via etch photoresist stripping, post stripping inspection, and via metallization itself. These delays must be less than about five hours in total to prevent water vapour being chemically absorbed by the spin-on glass.

2) The specification of the use of tightly controlled ambient dry boxes for wafer storage if extended periods are needed between these steps. This avoids slow chemical absorption of water vapour by the exposed SOG by imposing a very dry nitrogen or inert gas ambient.

3) The specification of an ex-situ pre-metallization water vapour desorption step in an independent vacuum or dry ambient batch system must be for an extended period of more than about 30 minutes and at a temperature higher than about 400° C. but lower than about 530° C., just before entering the sputtering equipment. A quick re-exposure to ambient air of less than about one (1) hour before entering wafers in the sputtering equipment vacuum load-lock causes surface reabsorption and physical reabsorption of water vapour but prevent its chemical reabsorption will not occur to a too short re-exposure time.

4) The specification of an in-situ pre-metallization descrption step of adsorbed and physically absorbed water vapour in the load-lock or in the main chamber of the sputtering system. This is done at relatively low temperatures, typically between 250° and 400° C.

As a result, the descrption efficiency is function of the history of the wafer and its ambient air exposure time. This process is wafer history sensitive and residual water vapour in the wafer is not always negligible, thus causing the previously mentioned yield and reliability problem.

The article entitle "Application of Surface Reformed Thick Spin-on-Glass to MOS Device Planarization" (J. Electrochem. Soc., vol 137, no. 4, April 1990, pages 1212–1218; Shimida et al.) describes a novel post-deposition treatment known as reactive glass stabilization (RGS). This article is, however, only concerned with organic SOGs and supports the conventional view that inorganic or quasi-inorganic SOGs are incapable of forming films thicker than 0.2µ due to their inherent fragility and brittleness, which causes cracking during baking.

An object of this invention is to provide an quasi-inorganic or inorganic planarization layer having improved cracking characteristics.

According to the present invention there is provided in a method of manufacturing a semiconductor wafer, wherein at least one high-temperature resistant water absorbant, organic, inorganic or quasi-inorganic dielectric layer is formed between first and second layers of deposited interconnect material interconnected through vias opened in said dielectric layer, the improvement wherein an in-situ desorption of physically and chemically water vapour in a dry environment at a temperature of at least 400° C. and not more than 550° C. for a time sufficient to obtain a negligible desorption rate, said temperature exceeding by at least 25° C. the temperature to which the surface of the wafer will be exposed during a subsequent metallization step to form said second interconnect layer, etching via holes through said dielectric layer said first interconnect layer, and performing said subsequent metallization step to deposit said second interconnect layer extending through said via holes to said first interconnect tracks while maintaining said dry environment, said subsequent etching and metallization steps after said desorption step being performed without re-exposure of the wafer to ambient conditions.

In-situ in this context means that there is no ambient re-exposure of the wafer after the desorption step is completed.

While the organic, inorganic or quasi-inorganic dielectric layer is prefereably inorganic or quasi-inorganic spin-on glass, the invention is also applicable to polyimide used as a dielectric over the first level of metal interconnect, or any other high temperature (>400° C.) resistant organic dielectric.

This in-situ desorption can be carried out in the sputtering system itself, or in its load-lock. The resulting process, its yield and the reliability of the completed devices are not as sensitive to the wafers' history.

At any temperature, slow chemical desorption of water vapour from phosphorus or silicon is limited by the condensation rate of neighboring •POH or •SiOH groups, which depend on the •POH or •SiOH bond strength and statistical distances between neighboring •POH or •SiOH groups.

As condensation between neighboring groups occurs, the distance between residual groups increases and water vapour desorption rate eventually becomes negligible at that temperature. An increase of the temperature enables •POH or •SiOH groups at larger separation to enter into condensation reactions; the outgassing rate increases and eventually drops at that new temperature. If the new temperature is high enough, condensation of most if not all of the available •POH and •SiOH groups occurs and the SOG film becomes free from water vapour.

The chemical desorption temperature must exceed about 400° C. to ensure substantial condensation of these groups. If 400° C. is chosen as the desorption temperature, water vapour desorption will eventually drop to a negligible value as the condensation becomes more and more difficult. If the metallization step causes the substrate temperature to exceed the water vapour desorption temperature (400° C. in that case), via poisoning, stress migration, electro-migration, step coverage and other problems will occur.

The invention will now be described in more detail, by way of example only, with reference to the accompanying drawings in which.

Figure 1:
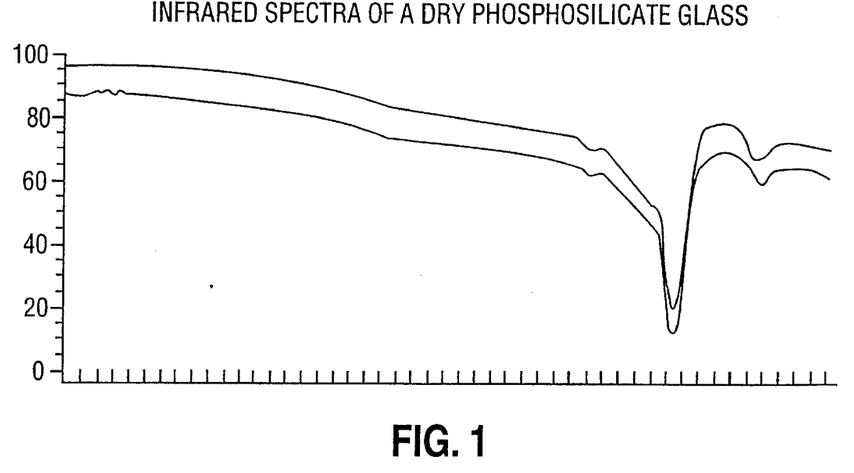
FIGS. 1 and 2 show respectively the infrared spectra of a dry phosphosilicate glass, and the infrared spectra of a water vapour saturated phosphosilicate.
Figure 2:
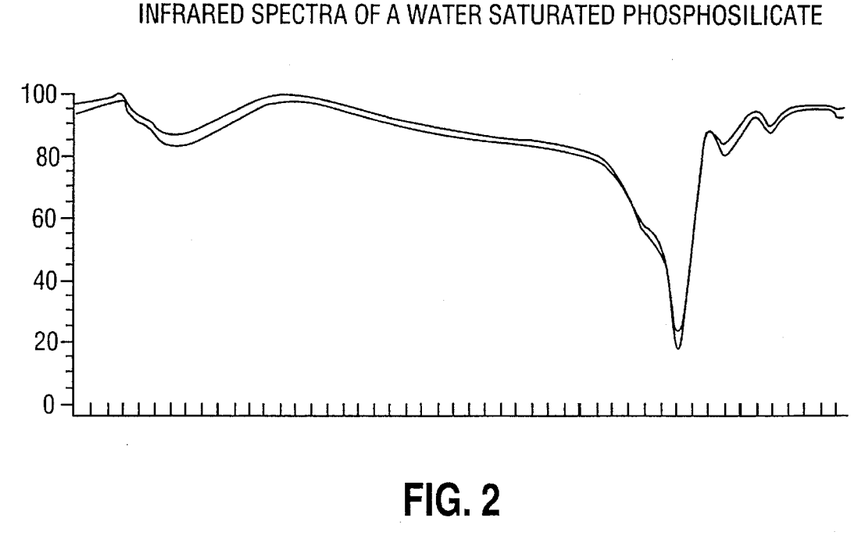
Figure 3:
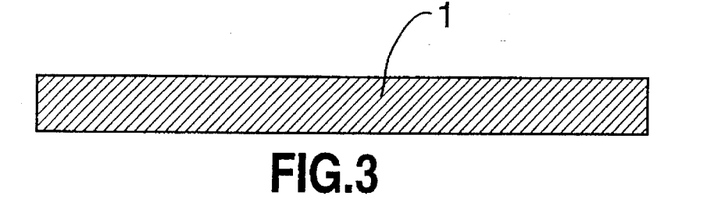
FIGS. 3, 4, 5, 6, 7, 8, 9, 10 and 11 show a sequence of steps in the fabrication of a semiconductor wafer.
Figure 4:
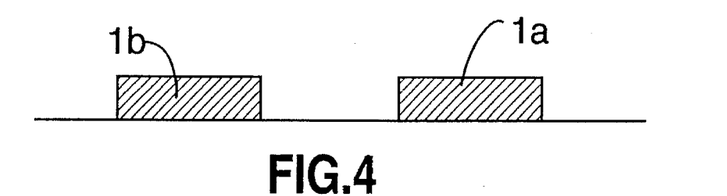

The effect of exposure of dry phosphorus doped inorganic silicate SOG thin films to water vapour can be seen in FIGS. 1 and 2.

Reference will now be made to FIGS. 3 to 11, which show the fabrication steps in a typical wafer fabrication process.

The non etch-back SOG process used in the fabrication of interconnection layers for high performance, high density multi-level metallization CMOS devices typically uses the following sequence shown in FIGS. 3 to 11.

A first level of temperature sensitive interconnect material 1 (FIG. 3), typically an aluminum alloy, combined or not with one or more layers of a refractory metal, typically a titanium-tungsten compound, is deposited in single wafer sputtering apparatus.

This first level of interconnect material 1 is plasma etched 1a, 1b (FIG. 4), typically in various chlorine and fluorine containing discharges, using standard photolithography techniques.

A first layer of relatively low temperature dielectric 2 (FIG. 5) is deposited, typically at a temperature lower than about 450° C., by single wafer PECVD or LPCVD equipments, over the previously etched interconnect tracks.

The phosphorus-doped inorganic SOG solution 3 (FIG. 6) is applied, typically in one or many coats by a single wafer SOG processor, over the first layer of dielectric 1. Being liquid, it fills crevices and it almost absent over high topography. Relatively low temperature heat treatment, typically less than about 500° C., is applied to cure and densify the SOG to form a hard and smooth glass. The resulting SOG film is not etched back.

A second layer of relatively low temperature dielectric 4 (FIG. 7) is then deposited, typically by single wafer PECVD or LPCVD equipments, over the cured SOG.

Via holes 5 (FIG. 8) are plasma etched, typically by single wafer fluorine containing discharges, to reach the tracks of the first level of interconnect.

A second level of temperature sensitive interconnect material 8 (FIG. 9), similar to the one used for the first level, is typically deposited by single wafer sputtering equipment.

Figure 10:
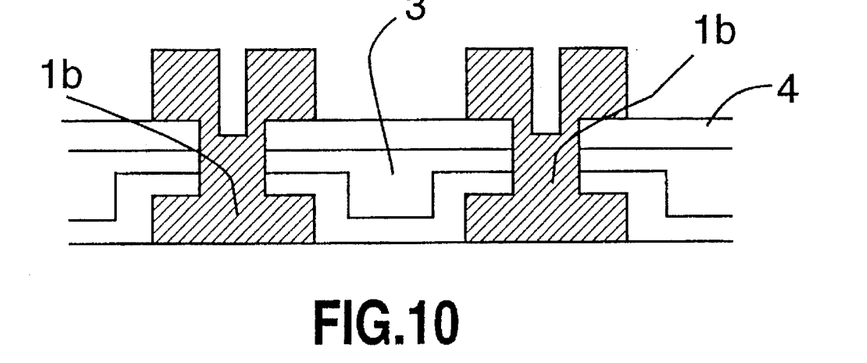

The second level of interconnect material 8 is etched similarly to the first level (FIG. 10).

The above sequence is repeated many times if more than two levels of temperature sensitive interconnect material are needed.

Figure 11:
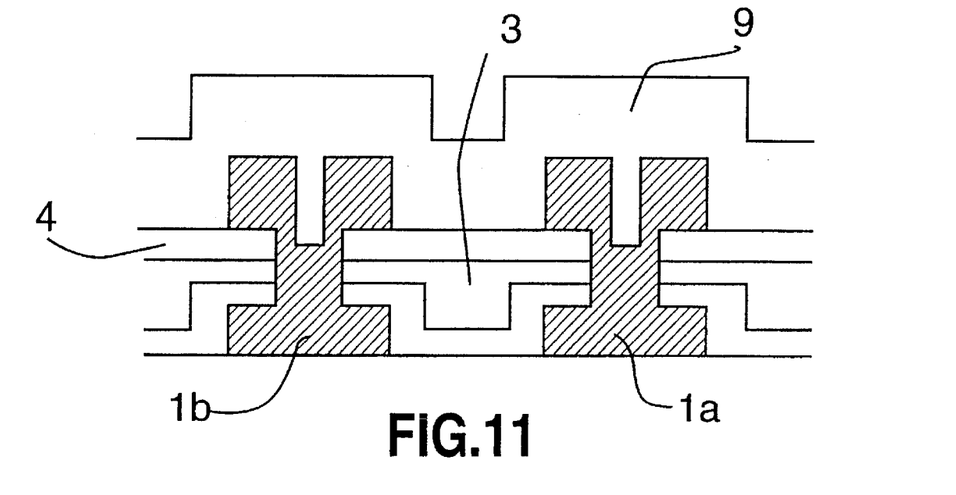

A top protective layer 9 is then deposited (FIG. 11).

In accordance with the invention this process is carried out in non batch type sputtering apparatus or in a load-lock thereof.

After opening the vias water vapour desorption is carried out at a temperature that should exceed 400° C. to ensure substantial chemical desorption by •POH and •SiOH condensation, exceed by at least 25° C. the highest temperature that the surface of the wafer will see during the metallization of these vias, not exceed 550° C. so as to minimize hillock growth, junction spiking and film cracking problems, and be applied for a sufficiently long time, at least 30 minutes, to obtain a negligible water vapour desorption rate at that desorption temperature.

Figure 12:
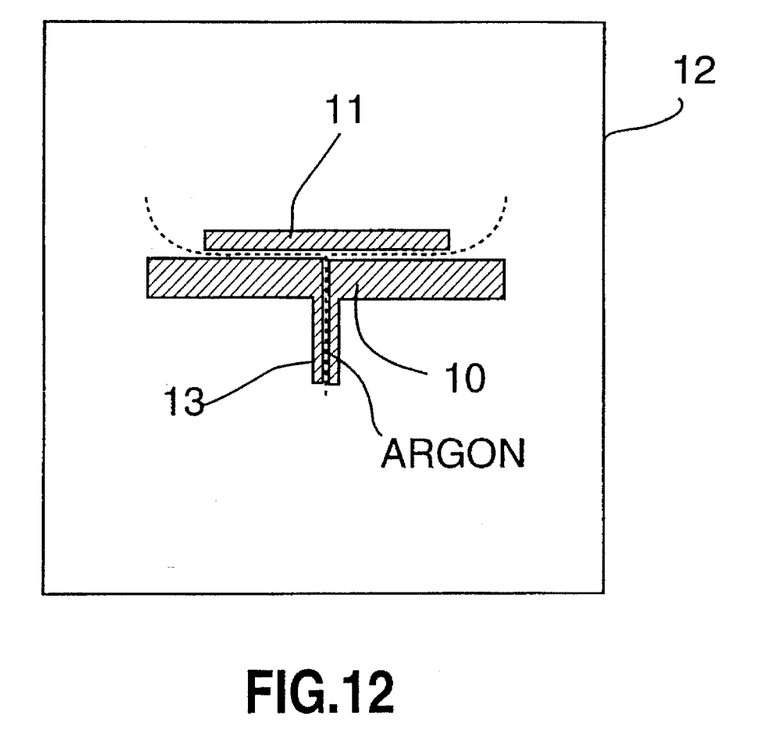
FIG. 12 is a section through a back side heating plate and wafer in a sputtering apparatus.

It is important to precisely control temperature of the wafer. Because of their lack of control over desorption temperatures, infrared heated and other thermal batch desorption systems are not suitable. A back side single wafer desorption hot plate 10 (FIG. 12), is preferred. Being under vacuum in sputtering apparatus 12, it is difficult to ensure a good thermal contact between this back side hot plate 10 and the wafer 11. By using a high pressure argon flow 13 on the back side of the wafer 10, between the wafer and the hot plate 10, it is possible to improve the heat transfer between the temperature controlled hot plate 10 and the wafer 11, thus ensuring a well controlled and reproducible desorption temperature.

Figure 13:
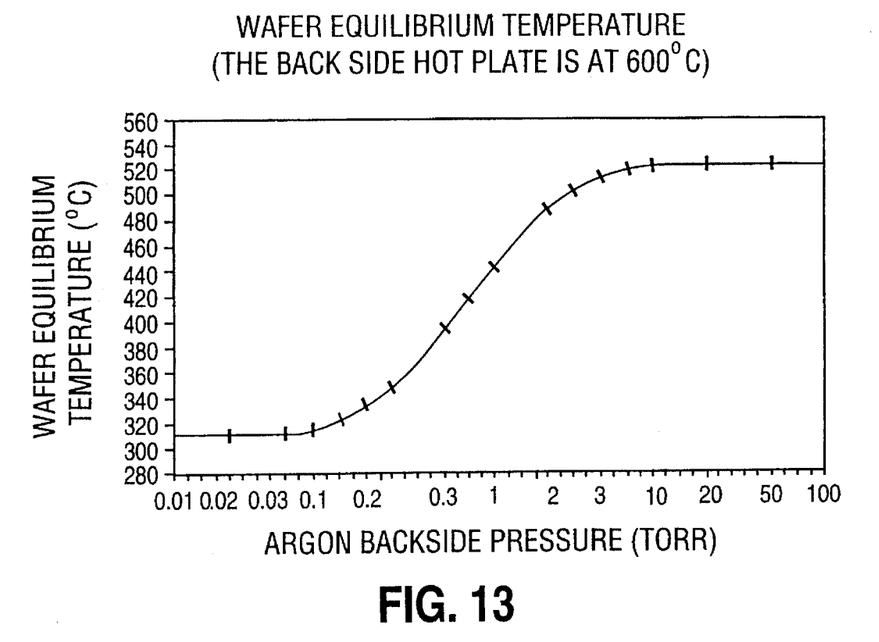
FIG. 13 is a graph showing the effect of back side argon pressure on hot plate heat transfer to the wafer.
Figure 14:
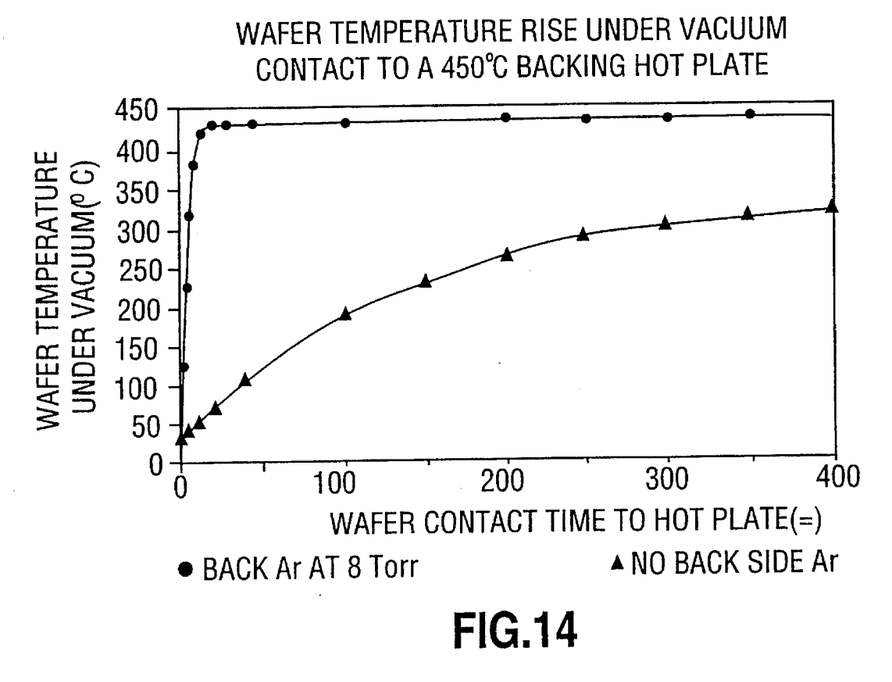
FIG. 14 is a graph showing the effect of varying back side argon pressure on hot plate heat transfer efficiency.

The effect of back side argon pressure on hot plate heat transfer to the wafer can be seen in FIG. 13.

Without argon pressurization of the gap between the back side of the wafer 11 and the hot plate 10, it is not possible to heat the wafer to more than about 325° C. because of poor thermal contact and wafer heat dissipation by infrared radiation. This maximum wafer temperature is not suitable for desorption of chemically absorbed water vapour, which needs a minimum of 400° C. with an optimum temperature to be chosen between 400° and 500° C. The long response time associated with the wafer temperature rise is not suitable for a single wafer desorption approach because of a low throughput.

Figure 5:
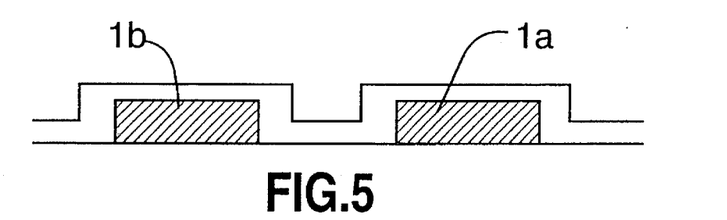
Figure 6:
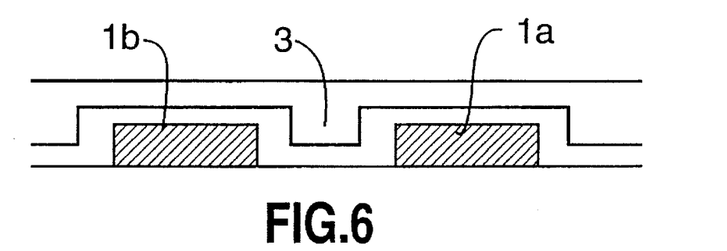
Figure 7:
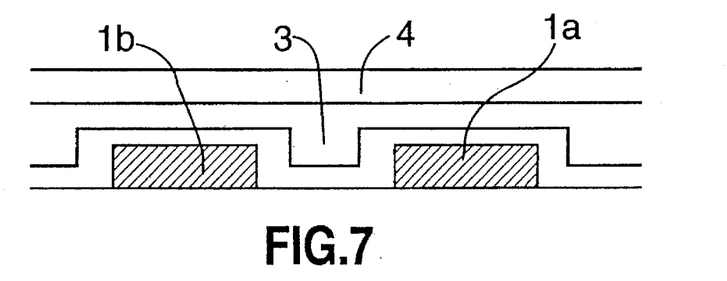
Figure 8:
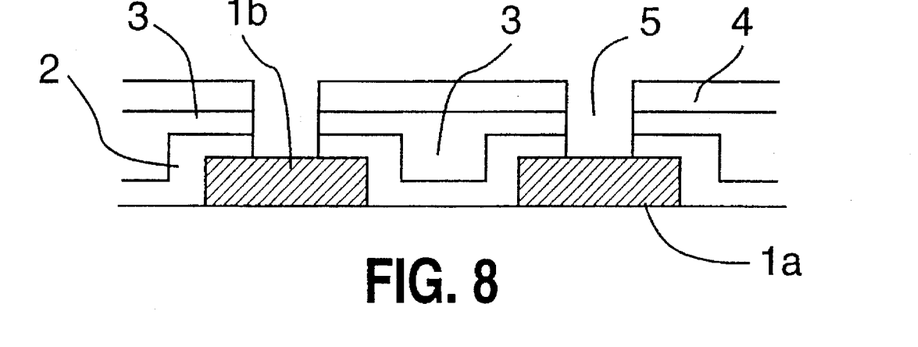
Figure 9:
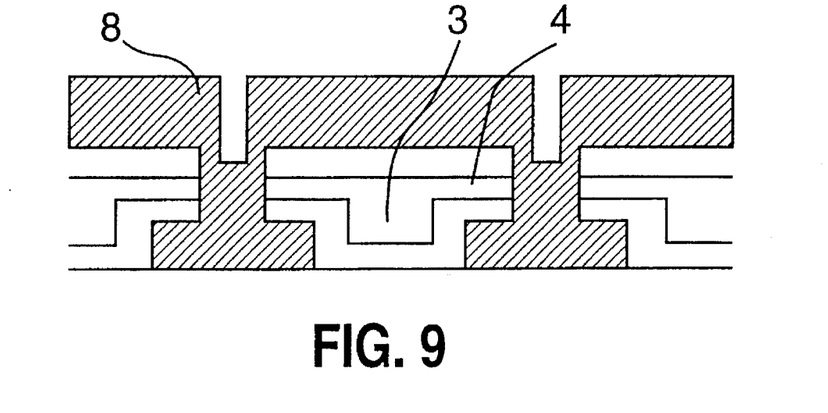

The use of an argon pressurized, back side wafer hot plate 10 gives a much better thermal contact between the hot plate and the wafer. This permits the wafer to reach, within less than 30 seconds, a temperature that is very close to the chuck temperature. Wafer temperatures will never equal chuck temperatures because of a non perfect thermal contact and an important infrared heat dissipation by the wafer at temperature exceeding 400° C. By clamping the wafer on this hot plate, it is possible to vary the pressure behind the wafer, as to vary the heat transfer efficiency, by adjusting the argon flow behind the wafer (FIG. 5).

This single wafer hot plate is used with a precise back side argon pressure that is adjusted between about 0.2 and 20 Torr to provide efficient heat transfer between the hot plate and the wafer, in a vacuum chamber which is maintained at a pressure lower than the back side wafer pressure.

The hot plate temperature and wafer back side argon pressure are selected to provide a quick ramp-up of the wafer temperature to the equilibrium wafer temperature within less than 45 seconds. The hot plate temperature and the wafer back side argon pressure are also selected to ensure a wafer equilibrium temperature that is higher than 400° C. and that exceeds by at least 25° C. the highest sputtering temperature that will be use to deposit the interconnect materials.

An infrared lamp can be used to estimate desorption time of adsorbed, physically absorbed as well as chemically absorbed water vapour at temperatures that permit chemical desorption to occur. A desorption time of at least two minutes at the wafer equilibrium temperature is enough to ensure a complete desorption of wafer vapour.

The described process, which uses an argon pressurized back side wafer hot plate, can ensure an in-situ, high throughput, and precisely controlled single wafer desorption of adsorbed, physically absorbed and chemically absorbed wafer vapour before sputtering interconnect materials. In-situ, in the context of this application, means a chamber configuration that prevents an exposure to ambient air between this desorption step and the sputtering of the interconnect materials, either in the same chamber or an independent one.

The described technique permits the reduction of die size of multi-level interconnect devices by reducing via dimensions due to an improved via desorption efficiency which reduces interconnect materials oxidation and specific contact resistance. It also permits better yields and more reliable multi-level interconnect CMOS devices. It prevents the specification of tightly controlled delays between manufacturing steps, the use of well controlled dry boxes for the storage of partly processed devices, and improves the process flow by reducing manufacturing constraints.

Thus, in summary the process is carried out in single wafer sputtering apparatus to ensure high throughput, high uniformity and precisely controlled high temperature and high bias metallization of aluminum alloys and Ti and W containing alloys and compounds, The water vapour desorption should be done rapidly to maintain a production compatible throughput of a non etch-back spin-on glass process for the interconnection of high performance and high density multi-level metallization CMOS devices, Adsorbed water vapour at the surface can be readily eliminated during vacuum pump-down at room temperature, Vacuum heating at about 150° C. is sufficient to quickly remove physically absorbed water vapour, and Vacuum heating at a temperature exceeding about 400° C. permits desorption of chemically absorbed water vapour, As neighboring •SiOH and •POH groups condensation occurs, the statistical distance between residual groups increases and water vapour desorption rate eventually becomes negligible, at that temperature.

A minimum desorption time of about two minutes is required, at that temperature, to obtain a negligible water vapour desorption rate, An increase of that temperature enables •POH or •SiOH groups at larger separations to enter into condensation reactions, thus causing water vapour desorption rate to increase and eventually drop, at that increased temperature, If the temperature is high enough, condensation of most if not all of the available •POH and •SiOH groups occurred and the SOG film becomes water vapour free.

Independently of the desorption temperature, this temperature must exceed by at least 25° C. the highest metallization temperature that will see the surface of the wafer during metallization. The wafer desorption temperature should not exceed about 550° C. to minimize hillock growth, junction spiking and films cracking problems, This technique permits the reduction of die size of multi-level interconnect devices by reducing via dimensions due to an improved via desorption efficiency which reduce interconnect materials oxidation and specific contact resistance. It also permits the manufacturing of better yield and more reliable multi-level interconnect CMOS devices, and prevents the specification of tightly controlled delays between manufacturing steps, the use of well controlled dry boxes for the storage of partly processed devices, and improves the process flow by reducing manufacturing constraints.

Although this invention is more beneficial to phosphorus doped inorganic SOG, it is also beneficial to: boron, arsenic, lead or other metal doped inorganic SOGs and combinations of the above, to undoped inorganic SOG, undoped quasi-inorganic SOG which incorporate some —$CH_3$, —$C_2H_5$ or some others organic bonds or combinations of these, and to doped quasi-organic SOG which incorporate some organic bonds as well as phosphorus, boron, arsenic, lead or other metal.

This technique is also applicable to polyimide used as a dielectric over the first level of metal interconnect, or for any other high temperature (>400° C.) resistant organic dielectric.

This technique is also applicable to porous dielectrics deposited by various chemical vapour deposition at temperatures lower than 500° C.: low pressure chemical vapour deposition of dielectrics, LPCVD, plasma enhanced chemical vapour deposition of dielectrics, PECVD, laser assisted chemical vapour deposition of dielectrics, LACVD, as well as photo enhanced chemical vapour deposition of dielectrics, PhCVD. The technique also applies to sputtered dielectrics as well as dielectrics deposited by electron cyclotron resonance, ECR.

Although this technique is described for sputtered interconnect materials, it is also applicable to other deposition techniques for interconnect materials: low pressure chemical vapour deposition of interconnects, plasma enhanced chemical vapour deposition of interconnects, laser assisted chemical vapour deposition of interconnects, photo enhanced chemical vapour deposition of interconnects, thermal evaporation, as well as electron beam evaporation of interconnects and electron cyclotron resonance deposition of interconnects.

While this technique has been described with reference to a single or a two chamber sputtering system, in which the desorption is respectively done in-situ in the sputtering chamber itself, or in-situ in the desorption load-lock from where the wafer is transported under vacuum to the sputtering chamber, it also apply to cluster tools or other integrated multi-chamber systems for which wafer transport is performed under vacuum between the various chambers.

Although this technique uses argon as the back side gas, it also apply to any other inert or reactive gas because the heat transfer is more function of the gas pressure than of the gas identity. Gas mixtures are also possible.

It is possible to use a heating chuck that supports more than one wafer. In this case, the back side gas is injected between each individual wafer and the hot platen, thus insuring a uniform, fast, and well controlled, multi-wafer desorption.

I claim:

1. A method of manufacturing a semiconductor wafer, comprising the steps of:
   a) depositing a first layer of interconnect material on a substrate;
   b) etching said interconnect material to form interconnect tracks;
   c) depositing a first low temperature dielectric layer over said interconnect tracks;
   d) planarizing said first low temperature dielectric layer with a quasi-inorganic or inorganic spin-on glass by a non-etchback process;
   e) depositing a second low temperature dielectric layer over said spin-on glass;
   f) etching via holes through said dielectric and spin-on glass layers to reach the tracks of said first interconnect layer;
   g) performing a desorption of physically and chemically water vapour in a dry environment at a temperature of at least 400° C. for at least 30 minutes;
   h) performing a subsequent metallization step to deposit a second interconnect layer extending through said via holes to said first interconnect tracks while maintaining said dry environment; and
   i) wherein said desorption is carried out in situ at a temperature at least 25° C. higher than the temperature at which said subsequent metallization step is carried out and not more than 550° C., and said subsequent metallization step after said desorption step is performed without re-exposure of the wafer to ambient conditions.

2. A method of manufacturing a semiconductor wafer as claimed in claim 1, characterized in that said wafer is heated during said desorption step with a back side hot plate.

3. A method of manufacturing a semiconductor wafer as claimed in claim 2, characterized in that high pressure inert gas is caused to flow between said wafer and hot plate to improve heat transfer between the hot plate and the wafer.

4. A method of manufacturing a semiconductor wafer as claimed in claim 3, characterized in that said inert gas is argon.

5. A method of manufacturing a semiconductor wafer as claimed in claim 4, characterized in that the argon is maintained at a pressure between 0.2 and 20 Torr.

6. A method of manufacturing a semiconductor wafer as claimed in claim 5, characterized in that said desorption is carried out in a vacuum maintained at a pressure lower than the back side wafer pressure.

7. A method of manufacturing a semiconductor wafer as claimed in claim 1, characterized in that said metallization is effected in a sputtering apparatus, and said desorption step is carried out in said sputtering apparatus or a load-lock thereof.

8. A method of manufacturing a semiconductor wafer as claimed in claim 1, characterized in that said spin-on glass is phosphorus-doped inorganic spin-on glass.

9. A method of manufacturing a semiconductor wafer as claimed in claim 1, characterized in that said time for performing said in-situ desorption is at least thirty minutes.

* * * * *